US006262592B1

(12) United States Patent
Kim

(10) Patent No.: US 6,262,592 B1
(45) Date of Patent: Jul. 17, 2001

(54) VOLTAGE ADJUSTING CIRCUIT

(75) Inventor: Yong Hwan Kim, Cheongju (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/412,327

(22) Filed: Oct. 5, 1999

(30) Foreign Application Priority Data

Feb. 25, 1999 (KR) .................................................. 99/6362

(51) Int. Cl.[7] ..................................................... H03K 17/16
(52) U.S. Cl. ................................ 326/32; 326/31; 326/34
(58) Field of Search ................................ 326/31, 32, 33, 326/34, 115, 126, 127

(56) References Cited

U.S. PATENT DOCUMENTS 4,095,164 * 6/1978 Ahmed .................................... 323/8
5,134,309 * 7/1992 Matsumoto et al. ................ 307/264
5,146,152 * 9/1992 Jin et al. ............................. 323/280
5,432,432 * 7/1995 Kimura ............................... 323/313
5,783,935 7/1998 Kyung ................................. 323/313

* cited by examiner

*Primary Examiner*—Michael Tokar
*Assistant Examiner*—Anh Q. Tran
(74) *Attorney, Agent, or Firm*—Fleshner & Kim, LLP

(57) ABSTRACT

A voltage adjusting circuit includes a reference voltage generator generating a reference voltage, a differential amplifier comparing the reference voltage with a distribution voltage, and compensating for a variation of the reference voltage, and a voltage divider dividing a power supply voltage and generating a constant output voltage according to an output from the differential amplifier.

14 Claims, 3 Drawing Sheets

VOLTAGE ADJUSTING CIRCUIT

BACKGROUND OF THE INVENTION

1. Field of the Invention

The present invention relates to a voltage adjusting circuit, and in particular to a voltage adjusting circuit that can output a stable output voltage regardless of a temperature variation.

2. Description of the Background Art

In general, a high voltage must be applied to a drain of a memory cell in a program or erase operation of a flash memory. The high voltage is generated by using an external power source. To reduce unnecessary power consumption, a voltage adjusting circuit for constantly maintaining the high voltage regardless of the external power source is required.

Referring to FIG. 1, a conventional voltage adjusting circuit includes a reference voltage generator 10, a differential amplifier 12 and a voltage divider 14.

The voltage divider 14 has an NMOS transistor 31 connected in series between a power supply voltage Vcc and a ground voltage Vss, and resisters R1, R2 that are passive elements. A gate of the NMOS transistor 31 is connected to an output terminal of the differential amplifier 12, and a noninverted input terminal (+) and an inverted input terminal (−) of the differential amplifier 12 are connected respectively to a common node 50 of the resisters R1, R2 and an output terminal of the reference voltage generator 10.

The operation of the conventional voltage adjusting circuit will now be described.

The reference voltage generator 10 generates a reference voltage Vref from the external voltage Vcc. Thereafter, the reference voltage Vref is compared in the differential amplifier 12 with a divided voltage Vreg from the voltage divider 14. As a result, a turn-on degree of the NMOS transistor 31 is controlled by a comparison voltage Vdiff outputted from the differential amplifier 12, thus varying an output voltage Vout. In this case, the output voltage Vout is represented by the following expression.

$$Vout-Vref\times(1+R1/R2)$$

However, when the output voltage Vout is varied, the divided voltage Vreg is also varied by the resisters R1, R2. Therefore, the differential amplifier 12 controls the turn-on degree of the NMOS transistor 31 by comparing the reference voltage Vref with the varied distribution voltage Vreg. Accordingly, the conventional voltage adjusting circuit generates a final output voltage Vout by repeatedly performing the above operation until the levels of the reference voltage Vref and the distribution voltage Vreg are identical.

In general, a program or erase operation of a flash EEPROM cell, a lock-out level decision, a high voltage pumping, a negative voltage pumping and the like are more exactly and stably carried out when a voltage to be applied is influenced by a variation in temperature as less as possible. However, the conventional voltage adjusting circuit providing a voltage for performing the above-mentioned operations has a predetermined error according to a temperature variation.

That is, when a temperature is varied in the conventional voltage adjusting circuit, the reference voltage Vref outputted from the reference voltage generator is also varied. For example, the reference voltage Vref of a bandgap reference voltage generator has a variation rate of approximately 3%. The output voltage Vout has a predetermined error according to a temperature variation because the output voltage Vout is varied as much as the variation rate of the reference voltage Vref.

SUMMARY OF THE INVENTION

It is therefore an object of the present invention to provide a voltage adjusting circuit capable of outputting a stable output voltage by compensating for a variation of a reference voltage resulting from a temperature variation.

In order to achieve the above-described object of the present invention, there is provided a voltage adjusting circuit compensating for a variation of a reference voltage by connecting temperature compensation elements having different temperature constants to sources of first and second NMOS transistors composing a differential amplifier.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE INVENTION

In order to compensate for a variation of a reference voltage Vref according to a temperature variation, a voltage adjusting circuit according to the present invention connects temperature compensation elements having different temperature constants respectively to sources of first and second NMOS transistors 32, 33 included in a differential amplifier 16. Accordingly, an off-set corresponding to an amount of a variation of the reference voltage Vref resulting from the temperature variation is provided to the differential amplifier 16 through the temperature compensation elements, thereby constantly maintaining the output voltage Vout.

Figure 1:
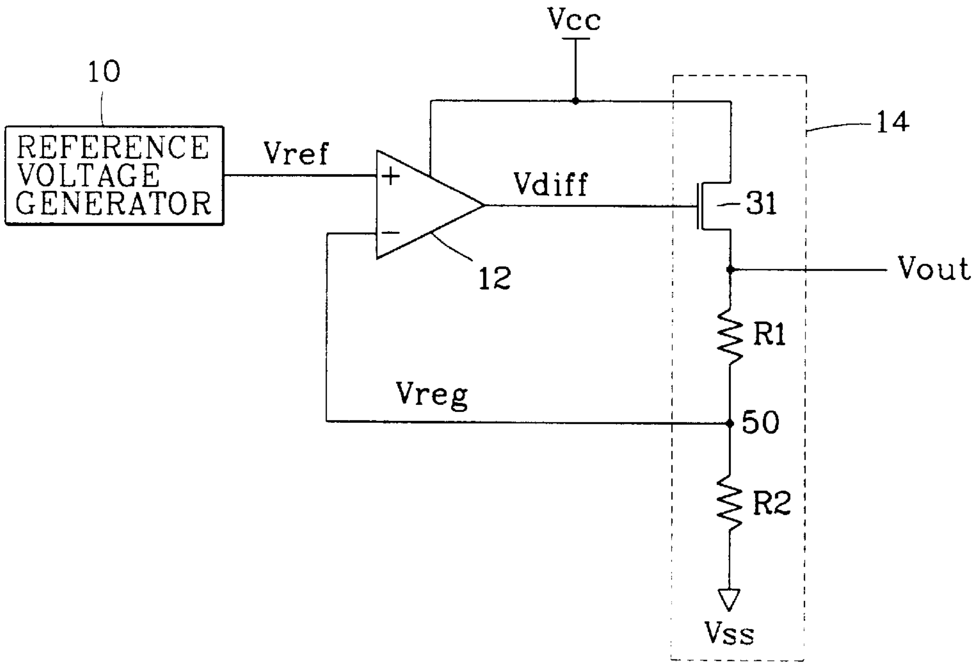
FIG. 1 BACKGROUND ART
FIG. 1 is a block diagram illustrating a conventional voltage adjusting circuit.
Figure 2:
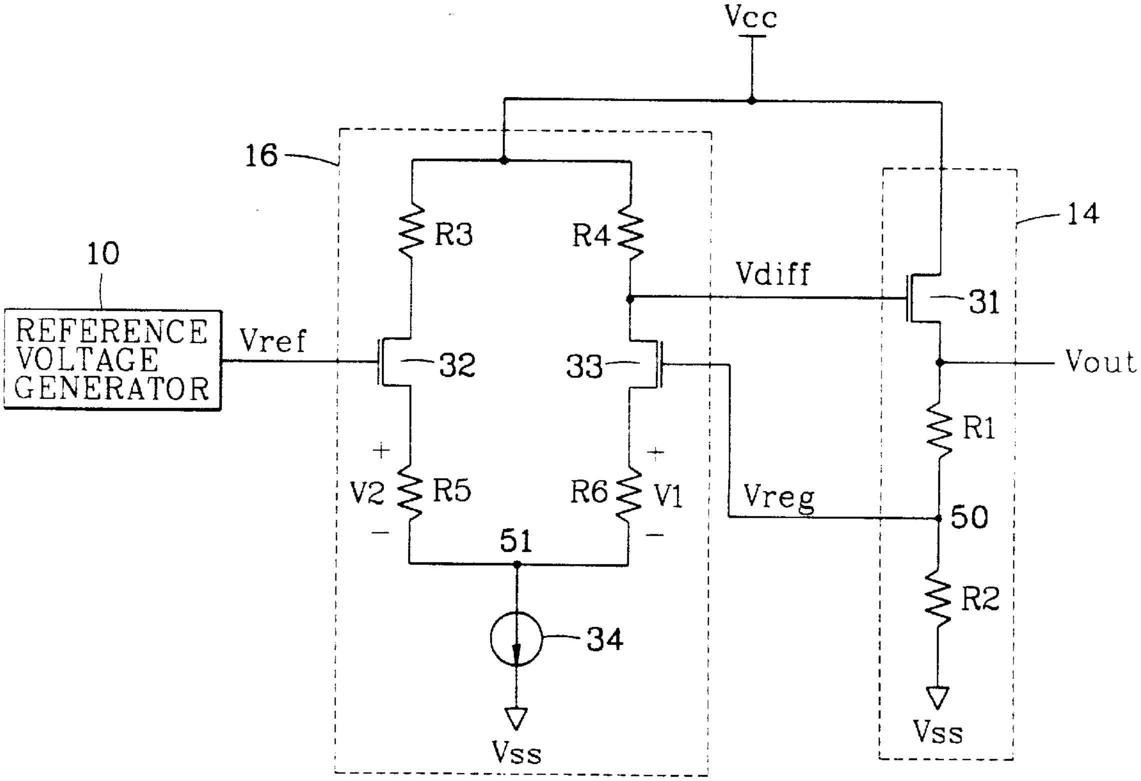
FIG. 2 is a block diagram illustrating a voltage adjusting circuit according to the present invention.

FIG. 2 illustrates a voltage adjusting circuit in accordance with a first embodiment of the present invention.

As shown in FIG. 2, the voltage adjusting circuit according to the present invention includes a reference voltage generator 10, a differential amplifier 16 and a voltage divider 14. The reference voltage generator 16 and the voltage divider 14 are identical in constitution and operation to the conventional ones.

The differential amplifier 16 includes first and second NMOS transistors 32, 33 each respectively receiving the reference voltage Vref and a divided voltage Vreg at their gates; load resisters R3, R4 connected to a power voltage Vcc and drains of the first and second NMOS transistors 32, 33; temperature compensation resisters R5, R6 respectively connected to sources of the first and second NMOS transistors 32, 33; and a current source 34 connected between a common node 51 of the temperature compensation resisters R5, R6 and a ground voltage Vss. Here, a temperature constant of the temperature compensation resister R5 is set greater than that of the temperature compensation resister R6.

The operation of the voltage adjusting circuit in accordance with the present invention will now be explained with reference to the accompanying drawings.

Figure 3A:
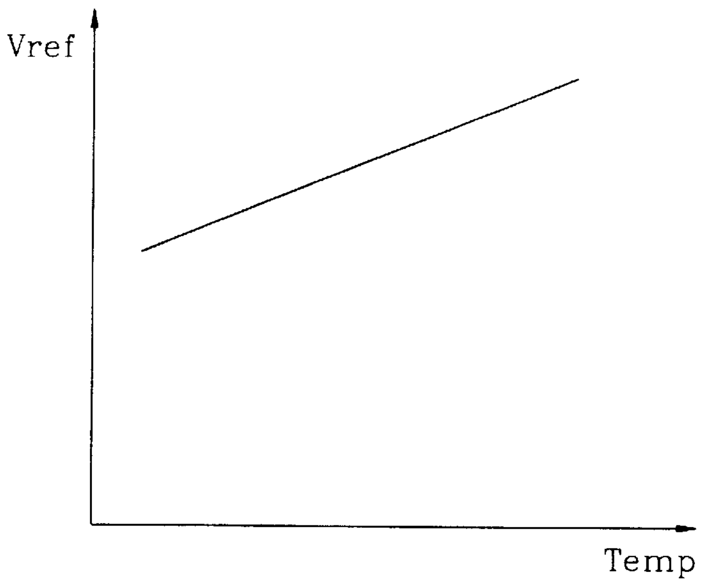
FIGS. 3A and 3B are graphs showing variations of a reference voltage and temperature compensation resisters according to a temperature variation in the configuration of FIG. 2.
Figure 3B:
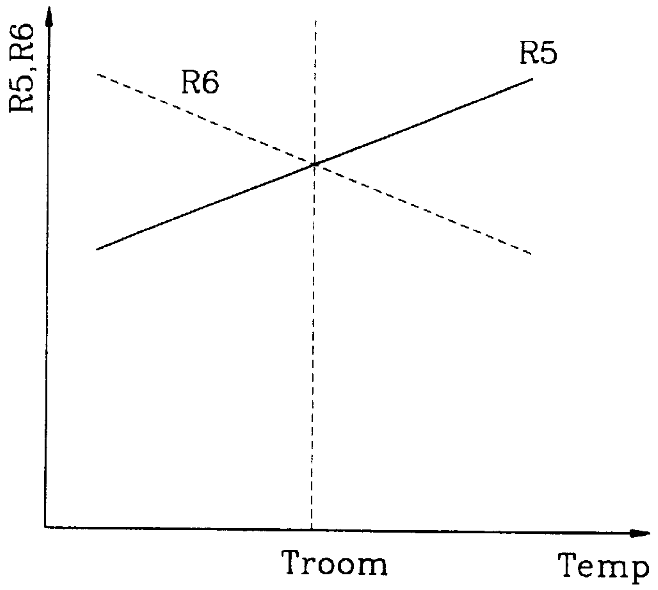
Figure 4A:
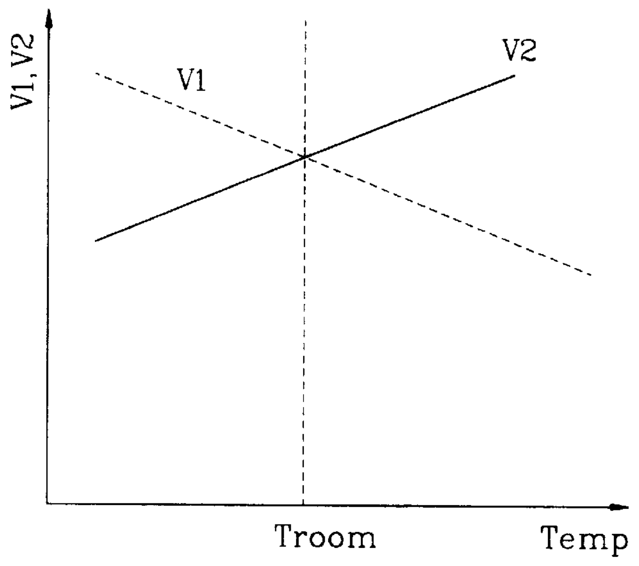
FIGS. 4A and 4B are graphs showing a voltage at both terminals of the temperature compensation resisters, the reference voltage, a divided voltage and a final output voltage according to a temperature variation in the configuration of FIG. 2.

FIG. 3A is a graph showing a variation of the reference temperature Vref according to a temperature variation Temp. Referring to FIG. 3A, when the reference voltage Vref from the reference voltage generator 10 is increased according to a temperature increase, a resistance value of the temperature compensation resister R5 is increased and a resistance value of the temperature compensation resister R6 is decreased. Accordingly, as shown in FIG. 4A, a voltage V2 measured across the temperature compensation resister R5 is increased, and a voltage V1 measured across the temperature compensation resister R6 is decreased. Here, it is presumed that voltages Vgs between the gates and sources of the first and second NMOS transistors 32, 33 are Vgs1 and Vgs2, respectively, and also presumed that a voltage difference between the voltages V1, V2 is Vd, Vgs1, Vgs2 and Vd are represented as follows.

$$Vgs1=Vref-V2$$

$$Vgs1=Vreg-V1$$

$$Vd=V2-V1$$

Accordingly, taking a temperature into account, the above expressions are represented as follows.

$$Vgs1'=Vref\cdot T-V2\cdot T$$

$$Vgs2'=Vreg\cdot T-V1\cdot T$$

$$Vd'=V2\cdot T-V1\cdot T$$

However, the differential amplifier 16 is operated for the voltages Vgs between the gates and sources of the first and second NMOS transistors 32, 33 to be equal, and thus "Vgs1'=Vgs2'" is satisfied. Therefore, the divided voltage Vreg is represented as the following expression.

$$Vreg=Vref-Vd$$

When a variation according to a temperature is considered, the above expression is represented as follows.

$$d(Vreg)=d(Vref)-d(Vd)$$

Figure 4B:
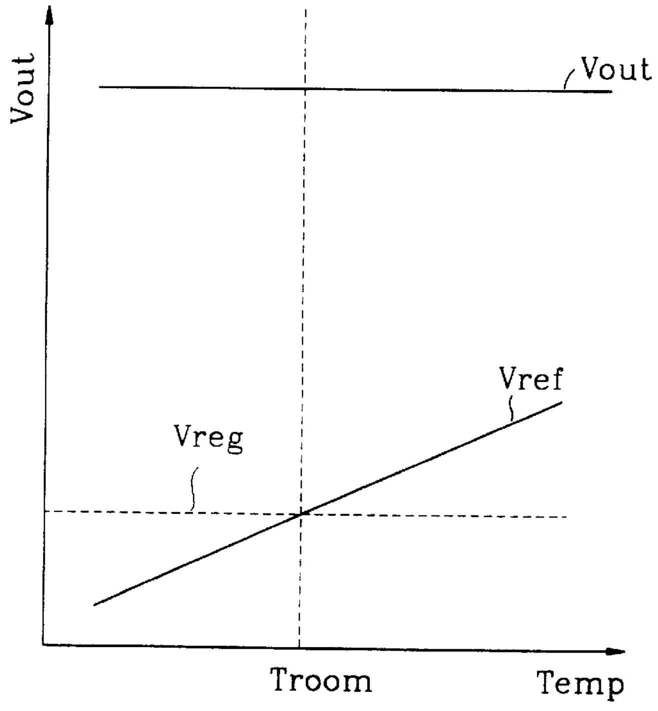

According to the above expression, a variation amount of the divided voltage Vreg is equal to a value obtained by subtracting a variation amount of the voltage Vd from a variation amount of the reference voltage Vref. Therefore, when the reference voltage Vref is equal in variation amount to the voltage Vd, the divided voltage Vreg is constantly maintained, regardless of the temperature variation. For instance, when the temperature constants of the temperature compensation resisters R5, R6 are defined as Tc1 and Tc2, respectively, and Tc1 is set greater than Tc2, as shown in FIG. 4B, even if the reference voltage Vref is varied according to the temperature variation, the divided voltage Vreg is constantly maintained, thereby removing an error of the output voltage Vout resulting from the temperature variation.

According to another embodiment of the present invention, a thermistor may be employed as the temperature compensation element, instead of the temperature compensation resister.

As discussed earlier, according to the present invention, a stable voltage is generated by connecting the resisters having different temperature constants respectively to the sources of the differential pair in the differential amplifier and by compensating for a variation of the reference voltage according to a temperature.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A voltage adjusting circuit comprising:

a reference voltage generator for generating a reference voltage;

a differential amplifier for comparing the reference voltage with a divided voltage, and for compensating for a variation of the reference voltage in accordance with a temperature, wherein the differential amplifier comprises, first and second transistors each receiving the reference voltage and the divided voltage, respectively, at a control electrode, first and second load resisters connected between a power supply voltage and second electrodes of the first and second transistors, respectively, first and second temperature compensation elements connected between first electrodes of the first and second transistors, respectively, and a first node, and a current source connected between the first node that connects the first and second temperature compensation elements and a ground voltage; and a voltage divider for dividing the power supply voltage to output the divided voltage, and for generating a constant output voltage in accordance with an output from the differential amplifier, wherein the first and second temperature compensation elements of the differential amplifier have unequal and opposite resistance changes as temperature increases so that the divided voltage is constantly maintained regardless of the temperature.

2. The circuit according to claim 1, wherein the first and second transistors are NMOS transistors.

3. The circuit according to claim 1, wherein a temperature constant of the first temperature compensation element is greater than that of the second temperature compensation element.

4. The circuit according to claim 1, wherein the first and second temperature compensation elements are resisters.

5. The circuit according to claim 1, wherein the first and second temperature compensation elements are thermistors.

6. The circuit according to claim 1, wherein the unequal and opposite resistance changes generate a voltage change across the first and second temperature compensation elements that is substantially equal in magnitude and opposite in sign to a voltage change in the reference voltage with temperature.

7. The circuit of claim 6, wherein the voltage divider comprises a third transistor, a first resister and a second resister connected in series between the power supply voltage and the ground voltage, wherein the divided voltage is output from a second node connecting the first and second resisters, and wherein the output voltage is output from a third node connecting the third transistor and the first resister.

8. A voltage adjusting circuit comprising:

reference voltage generator means for generating a reference voltage;

differential amplifier means for comparing the reference voltage with a divided voltage, and for compensating for a variation of the reference voltage in accordance with a temperature, wherein the differential amplifier means comprises, first and second transistor means for receiving the reference voltage and the divided voltage, respectively, at a control electrode, first and second resistance means connected to a first prescribed reference voltage and second electrodes of the first and second transistor means, respectively, first and second temperature compensation means each having a first terminal connected to first electrodes of the first and second transistor means, respectively, and current source means for generating current connected between a first node connecting second terminals of the first and second temperature compensation means and a second prescribed reference voltage; and voltage divider means for dividing the first prescribed reference voltage to output the divided voltage, and for generating an output voltage in accordance with an intermediate voltage output by the differential amplifier means, wherein the first and second temperature compensation means of the differential amplifier means have unequal resistance changes for generating a combined voltage change across the first and second temperature compensation means that is substantially equal in magnitude and opposite in sign to a voltage change in the reference voltage from the reference voltage generator means with temperature.

9. The circuit according to claim 8, wherein the first and second transistor means are NMOS transistors.

10. The circuit according to claim 8, wherein a temperature constant of the first temperature compensation means is greater than that of the second temperature compensation means.

11. The circuit according to claim 8, wherein the first and second temperature compensation means are resisters.

12. The circuit according to claim 8, wherein the first and second temperature compensation means are thermistors.

13. The circuit according to claim 8, wherein of the first and second temperature compensation means have opposite resistance changes as temperature increases for generating voltage drops across the temperature compensation means so that the divided voltage is constantly maintained regardless of the temperature.

14. The circuit of claim 13, wherein the voltage divider means comprises a first transistor, a first resister and a second resister connected in series between the first and second prescribed reference voltages, wherein the divided voltage is output from a second node connecting the first and second resisters, and wherein the output voltage is output from a third node connecting the first transistor and the first resister.

* * * * *